(12) United States Patent
Hung et al.

(10) Patent No.: US 9,543,232 B2
(45) Date of Patent: Jan. 10, 2017

(54) SEMICONDUCTOR PACKAGE STRUCTURE AND METHOD FOR FORMING THE SAME

(71) Applicant: MediaTek Inc., Hsin-Chu (TW)

(72) Inventors: Cheng-Chou Hung, Hukou Township, Hsinchu County (TW); Ming-Tzong Yang, Baoshan Township, Hsinchu County (TW); Tung-Hsing Lee, New Taipei (TW); Wei-Che Huang, Zhudong Township, Hsinchu County (TW); Yu-Hua Huang, Hsinchu (TW); Tzu-Hung Lin, Zhubei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/601,440

(22) Filed: Jan. 21, 2015

(65) Prior Publication Data
US 2016/0211194 A1    Jul. 21, 2016

(51) Int. Cl.
| H01L 23/48 | (2006.01) |
| H01L 29/06 | (2006.01) |
| H01L 21/761 | (2006.01) |
| H01L 21/768 | (2006.01) |

(52) U.S. Cl.
CPC ......... *H01L 23/481* (2013.01); *H01L 21/761* (2013.01); *H01L 21/76898* (2013.01); *H01L 29/0619* (2013.01); *H01L 2224/13* (2013.01); *H01L 2924/0002* (2013.01)

(58) Field of Classification Search
CPC .... H01L 23/481; H01L 23/585; H01L 21/761; H01L 21/76898; H01L 29/0619
See application file for complete search history.

(56) References Cited

U.S. PATENT DOCUMENTS

| 9,269,664 | B2 | 2/2016 | Yang et al. | |
| 2010/0090318 | A1* | 4/2010 | Hsu | H01L 21/76898 257/621 |
| 2010/0237386 | A1 | 9/2010 | Lin et al. | |
| 2011/0260330 | A1 | 10/2011 | Seo et al. | |
| 2012/0061795 | A1* | 3/2012 | Yen | H01L 21/76898 257/516 |
| 2012/0074515 | A1* | 3/2012 | Chen | H01L 23/585 257/491 |
| 2013/0147057 | A1 | 6/2013 | Horng et al. | |
| 2013/0154048 | A1* | 6/2013 | Lu | H01L 21/82348 257/496 |
| 2013/0264676 | A1* | 10/2013 | Yang | H01L 23/5226 257/508 |
| 2014/0264772 | A1* | 9/2014 | Horng | H01L 23/552 257/621 |

FOREIGN PATENT DOCUMENTS

| KR | 20110006946 A | 1/2011 |
| TW | 201344863 A | 11/2013 |

\* cited by examiner

*Primary Examiner* — Nicholas Tobergte
(74) *Attorney, Agent, or Firm* — McClure, Qualey & Rodack, LLP

(57) ABSTRACT

A semiconductor package structure and method for forming the same are provided. The semiconductor package structure includes a substrate and the substrate has a front side and a back side. The semiconductor package structure includes a through silicon via (TSV) interconnect structure formed in the substrate; and a first guard ring doped region and a second guard ring doped region formed in the substrate, and the first guard ring doped region and the second guard ring doped region are adjacent to the TSV interconnect structure.

18 Claims, 7 Drawing Sheets

SEMICONDUCTOR PACKAGE STRUCTURE
AND METHOD FOR FORMING THE SAME

FIELD OF THE INVENTION

The present invention relates to a semiconductor package structure, and in particular relates to a semiconductor package structure with a through silicon via (TSV) interconnect structure.

DESCRIPTION OF THE RELATED ART

In electronic engineering, a through silicon via (TSV) is a vertical electrical connection which passes completely through a silicon wafer or die. A TSV is formed by high-performance techniques, when compared to alternatives such as package-on-package. A TSV is used to create three-dimensional (3D) semiconductor packages and 3D integrated circuits. The density of the via of a TSV is substantially higher than the alternatives as the length of connections thereby are shorter.

An insulating liner of the conventional TSV serves as a capacitor between the silicon wafer and the TSV via plug. In high-speed applications (e.g. RF applications), the electrical impedance of a conventional TSV is reduced due to the insulating liner. When high speed circuits (e.g. digital circuits) transmit signals, the signals are coupled from the high speed circuits to other nodes such as the TSVs of analog circuits. Thus, noise coupling occurs and interferes with the other sensitive circuits (e.g. analog circuits), affecting the overall performance of the semiconductor package, which requires a high clock rate and analog precision.

Thus, a novel noise coupling suppression structure for a semiconductor package with a TSV interconnect is desirable.

BRIEF SUMMARY OF THE INVENTION

A detailed description is given in the following embodiments with reference to the accompanying drawings.

A semiconductor package structure is provided. The semiconductor package structure includes a substrate; a through silicon via (TSV) interconnect structure formed in the substrate; and at least two guard ring doped regions formed in the substrate, wherein the guard ring doped regions are adjacent to the TSV interconnect structure.

A method for forming a semiconductor package structure is provided. The method includes providing a substrate and forming at least two guard ring doped regions in the substrate. The method also includes forming a trench through the substrate from a back side of the substrate and conformally forming an insulating layer lining the back side of the substrate, a bottom surface and sidewalls of the trench. The method further includes removing a portion of the insulating layer on the back side of the substrate to form a through via; and forming a conductive material in the through via, wherein a through silicon via (TSV) interconnect structure is formed by the insulating layer and the conductive material.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
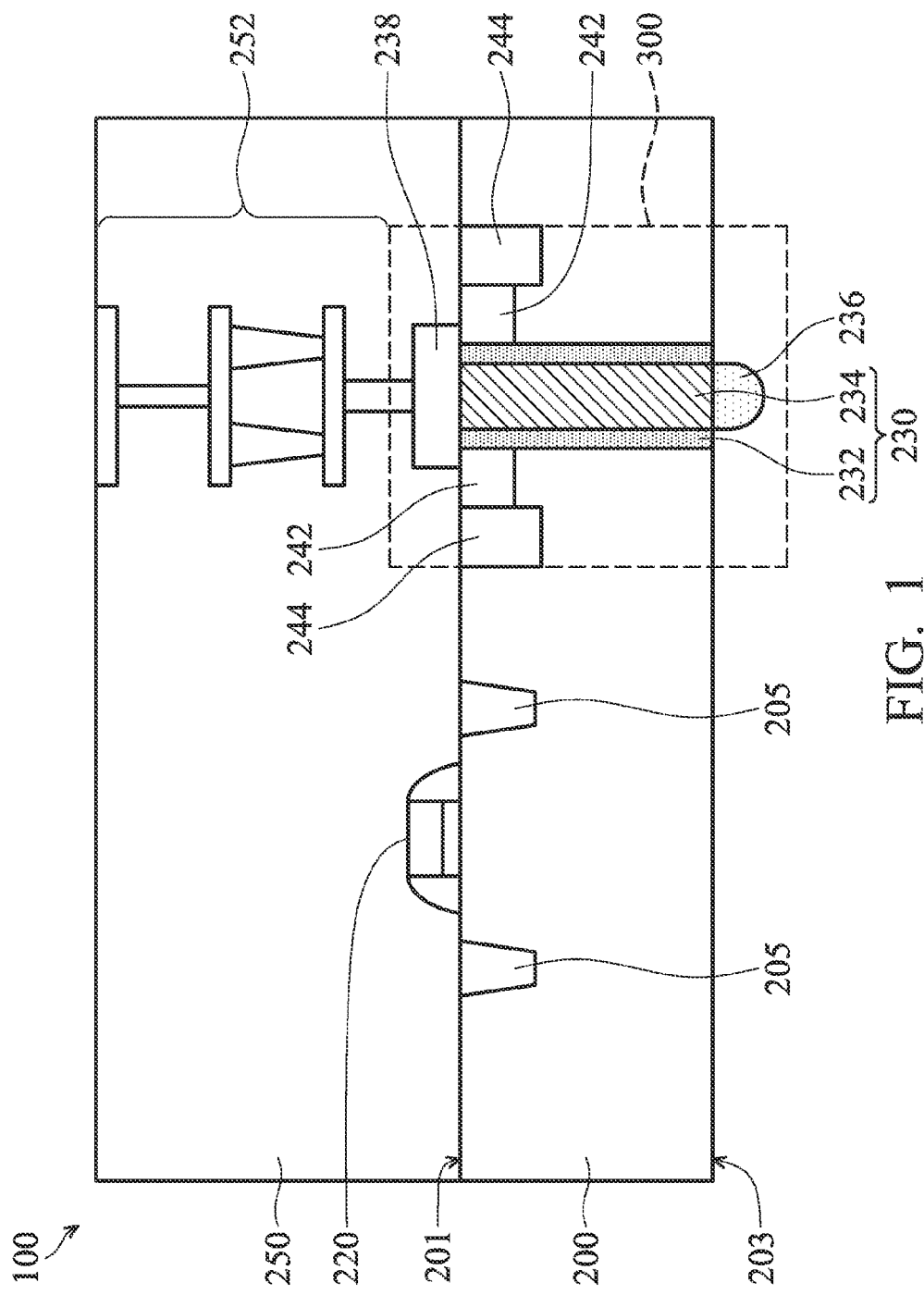
FIG. 1 shows a cross-sectional representation of a semiconductor package structure, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

FIG. 1 shows a cross-sectional representation of a semiconductor package structure 100 which is a noise coupling suppression structure, in accordance with some embodiments of the disclosure. The semiconductor package structure includes a substrate 200. The substrate 200 has a front side 201 and a back side 203 opposite to the front side 201. In some embodiments, the substrate 200 may be made of silicon or other semiconductor materials. Alternatively or additionally, the substrate 200 may include other elementary semiconductor materials such as germanium. In some embodiments, the substrate 200 is made of a compound semiconductor such as silicon carbide, gallium arsenic, indium arsenide, or indium phosphide. In some embodiments, the substrate 200 is made of an alloy semiconductor such as silicon germanium, silicon germanium carbide, gallium arsenic phosphide, or gallium indium phosphide. In some embodiments, the substrate 200 includes an epitaxial layer. For example, the substrate 200 has an epitaxial layer overlying a bulk semiconductor.

An integrated circuit device 220, such as a transistor, is formed on the front side 201 of the substrate 200. Isolation structures 205 are formed in the substrate 200 and are used to isolate the integrated circuit device 220 with other devices (not shown).

A through silicon via (TSV) interconnect structure 230 is formed through the substrate 200, and it is extended from the front side 201 of the substrate 200 to the back side 203 of the substrate 200. TSV structure 230 includes an insulating layer 232 and a conductive material 234. In some other embodiments, a diffusion barrier layer (not shown) is formed between the insulating layer 232 and the conductive material 234.

The insulating layer 232 is made of an insulating material, such as oxides or nitrides. The insulating layer 232 may be formed by using a plasma enhanced chemical vapor deposition (PECVD) process or another applicable process. In some embodiments, the conductive material 234 is made of copper, copper alloy, aluminum, aluminum alloys, or combinations thereof. In some embodiments, the conductive material 234 is formed by plating.

A conductive bump 236 is formed on the conductive material 234 and on the back side 203 of the substrate 200. The conductive bump 236 is made of conductive materials, such as copper, copper alloy, aluminum, aluminum alloys, or combinations thereof.

A poly pattern 238 is formed on the conductive material 234 and on the front side 201 of the substrate 200. The poly pattern 238 is used to serves as an etching stop layer An interconnect structure 252 is formed on the substrate 200. In some embodiments, the interconnect structure 252 includes contact plugs and conductive features. Conductive features are embedded in an inter-metal dielectric (IMD) layer 250. In some embodiments, the IMD layer 250 is made of silicon oxide. In some embodiments, the IMD layer 250 includes multiple dielectric layers of dielectric materials. The interconnect structure 252 shown is merely for illustrative purposes. The interconnect structure 252 may include other configurations and may include one or more conductive lines and via layers.

At least two guard ring doped regions 242 and 244 are formed adjacent to the TSV structure 230. As shown in FIG. 1, a pair of first guard ring doped regions 242 are formed in the substrate 200 and adjacent to the TSV structure 230. A pair of second guard ring doped regions 244 are formed adjacent to the first guard ring doped regions 242. The first and second guard ring doped regions 242 and 244 are coupled to a ground terminal GND. Therefore, the noise coupling from the substrate 200 or the TSV structure 230 are transmitted to the first and second guard ring doped regions 242 and 244 and then to the ground terminal GND. Although FIG. 1 only shows one TSV structure 230, more than one TSV may be formed to pass through the substrate 200.

Figure 2A:
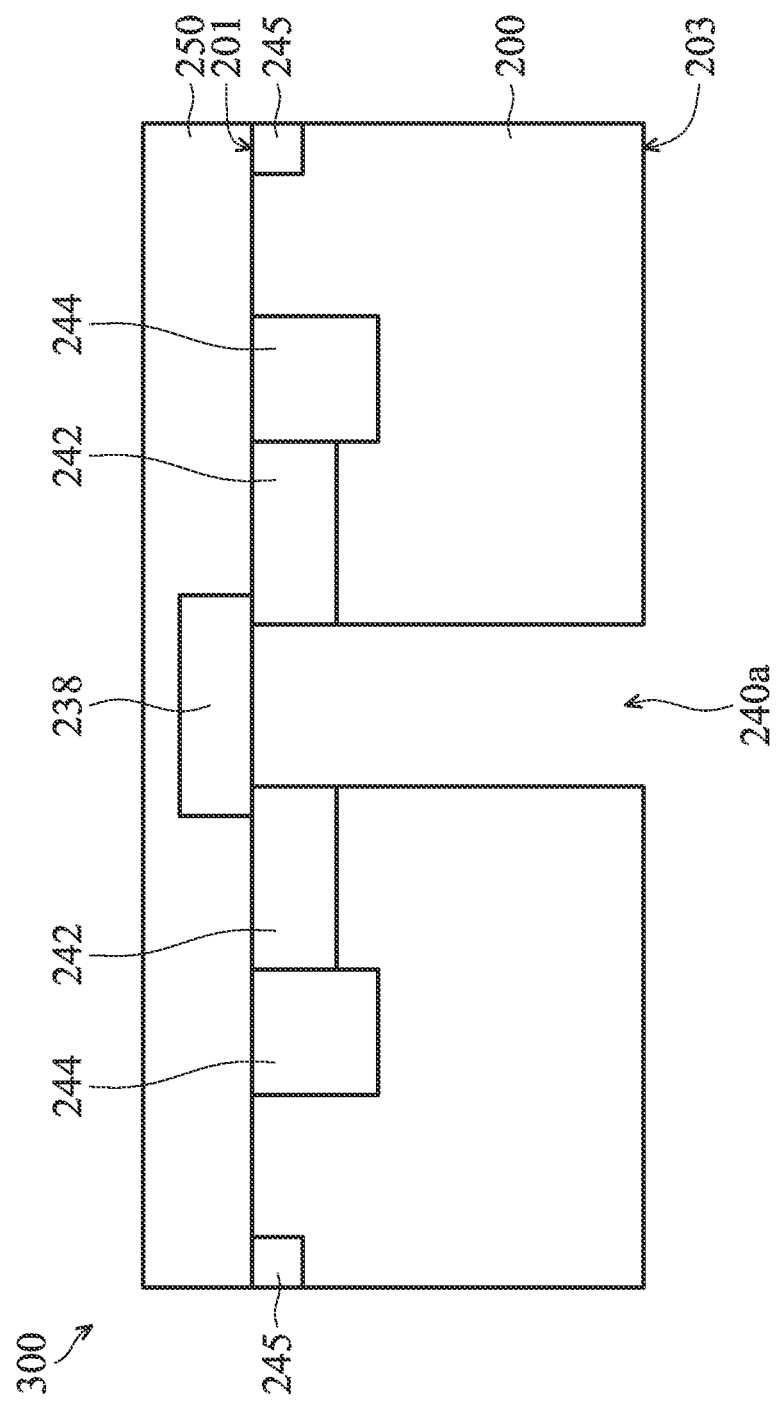
FIGS. 2A-2D show cross-sectional representations of various stages of forming a semiconductor package structure, in accordance with some embodiments of the disclosure.

FIGS. 2A-2D show cross-sectional representations of various stages of forming a semiconductor package structure, in accordance with some embodiments of the disclosure. FIG. 2A is an enlarged cross-sectional representation of a region 300 of the semiconductor package structure 100.

As shown in FIG. 2A, the substrate 200 is provided. The materials of the substrate 200 are described above, and thus are omitted here. A pair of first guard ring doped regions 242 are formed in the substrate 200. A pair of second guard ring doped regions 244 are formed adjacent to the first guard ring doped regions 242. Note that the guard ring doped regions 242 and 244 are adjoined to each other.

A conductive type of the first guard ring doped regions 242 is different from that of the second guard ring doped regions 244. In some embodiments, the first guard ring doped regions 242 are n-type guard ring doped regions, and second guard ring doped regions 242 are p-type guard ring doped regions. N-type guard ring doped regions comprise n-type heavily ($n^+$) doped region in a n-well region. P-type guard ring doped regions comprise p-type heavily ($P^+$) doped region in a p-well region.

The N-type guard ring doped regions 242 are configured to transmit a noise signal with a high frequency, such as in a range from about few MHz to about several GHz. The P-type guard ring doped regions 244 are configured to transmit the noise signal with low frequency, such as is in a range from about few MHz to about several GHz. Because the N-type guard ring doped regions 242 and P-type guard ring doped regions 244 are simultaneously formed in the substrate 200, noise signals with a high or low frequency can be transmitted to the ground GND. Therefore, the noise can be effectively decreased.

A plurality of well regions 245 are formed adjacent to the second guard ring doped regions 244. In some embodiments, when the substrate 200 is a p-type substrate, and the well regions 245 are p-type well regions. An un-doped region between the second guard ring doped regions 244 and the well regions 245 is called a native region. The native region is used to increase resistivity without any dopant. The noise may be reduced by higher resistivity.

After first guard ring doped regions 242 and second guard ring doped regions 244 are formed, the IMD layer 250 is formed on the front side 203 of the substrate 200. Afterwards, the poly pattern 238 is formed in the IMD layer 250 and on the front side 203 of the substrate 200. The poly pattern 238 is used as an etching stop layer for a subsequent etching process.

Afterwards, a photolithography process and an etching process are performed to the substrate 200 from the back side 203 of the substrate 200 until the poly pattern 238 is exposed. A trench 240a is thereby formed through the substrate 200.

Figure 2B:
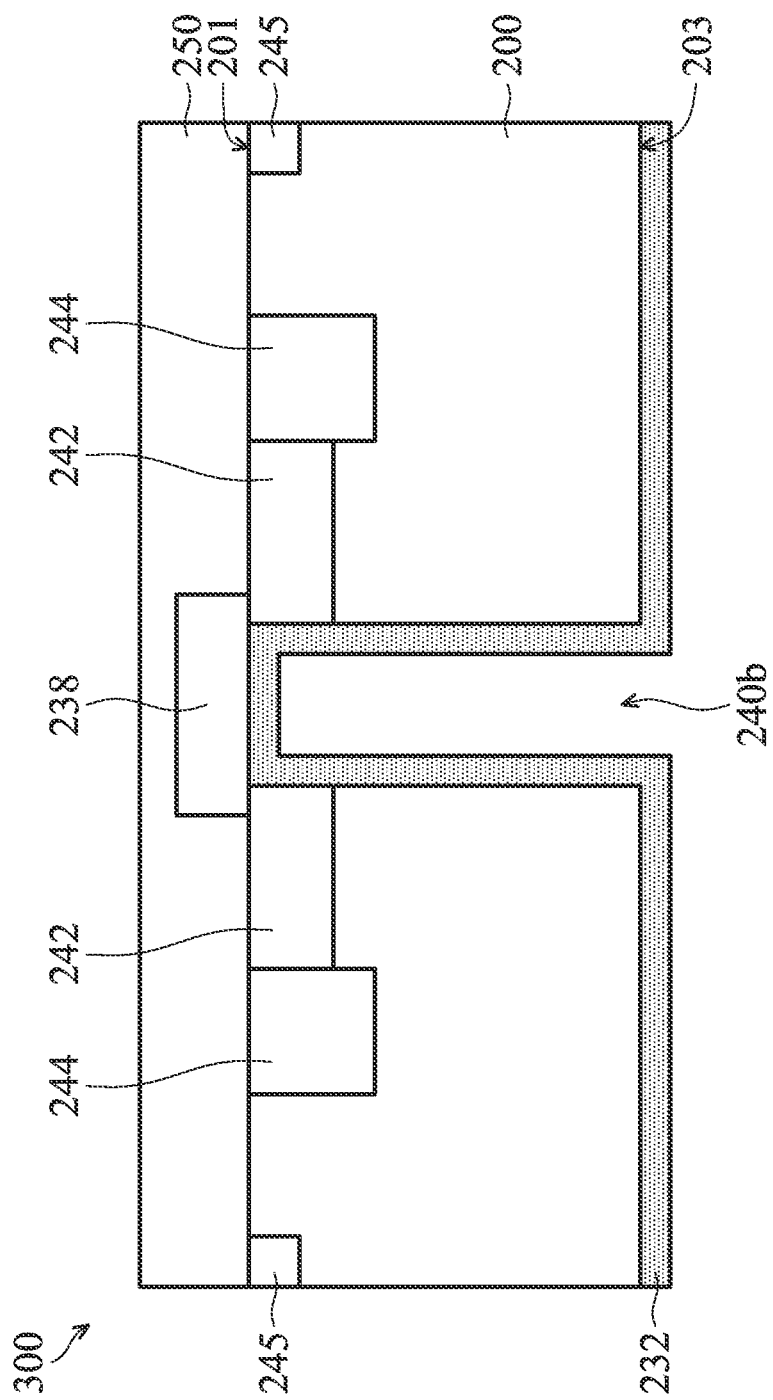

After the trench 240a is formed, the insulating layer 232 is conformally formed lining the back side 203 of the substrate 200, and a bottom surface and sidewalls of the trench 240a as shown in FIG. 2B, in accordance with some embodiments of the disclosure. The insulating layer 232 is made of an insulating material, such as oxides or nitrides.

Figure 2C:
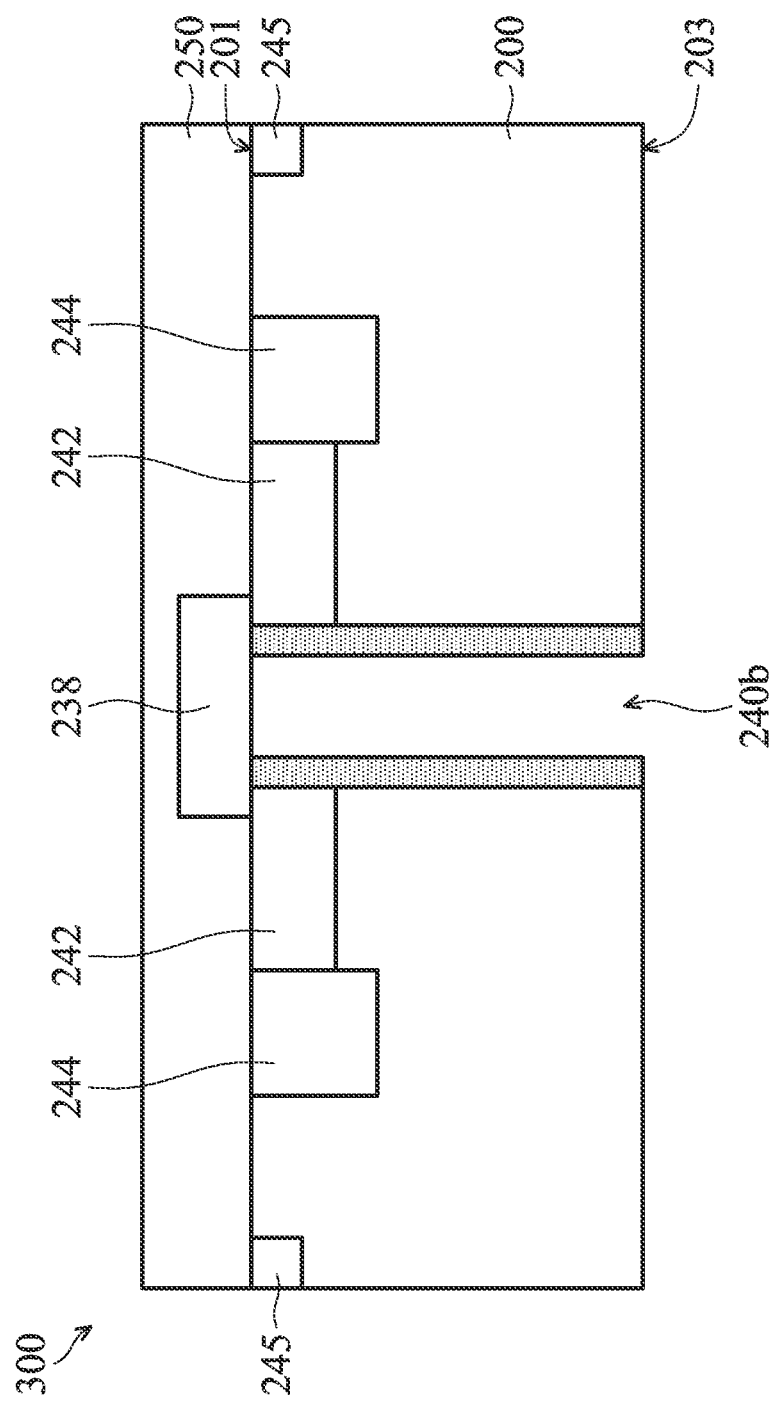

After the insulating layer 232 is formed, an etching back process is performed to the back side 203 of the substrate 200 to remove the insulating layer 232 formed on the back side 203 of the substrate 200 and on the bottom surface of the trench 240 as shown in FIG. 2C, in accordance with some embodiments of the disclosure. As a result, the poly pattern 238 is exposed and a through via 240b is formed. In some embodiments, the etching back process is a wet etching process or a dry etching process.

Figure 2D:
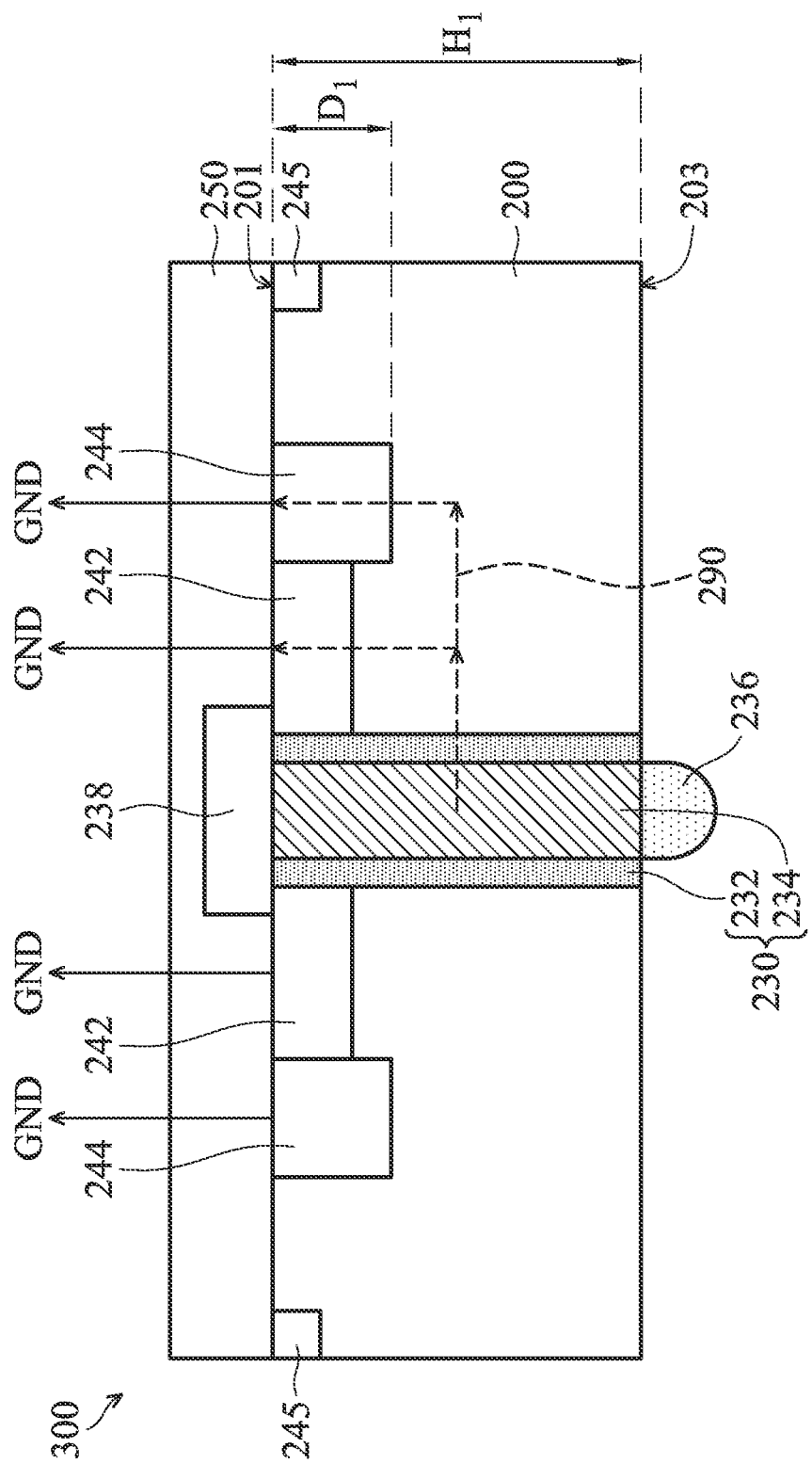

After the through via 240b is formed, a conductive material 234 is filled into the through via 240b and on the back side 203 of the substrate 200 as shown in FIG. 2D, in accordance with some embodiments of the disclosure. In some embodiments, the conductive material 234 is made of copper (Cu), copper alloy, aluminum (Al), aluminum alloys, or combinations thereof. In some embodiments, the conductive material 234 is formed by plating.

Afterwards, a polishing process is performed to remove the excess of the conductive material 234 outside of the through via 240b. In some embodiments, the polishing process is a chemical mechanical polishing (CMP) process. Therefore, the TSV structure 230 including the insulating layer 232 and the conductive material 234 is formed.

After the polishing process, a conductive bump 236 is formed on the conductive material 234. In some embodiments, the conductive bump 236 is a solder bump. In some embodiments, conductive material 234 is made of conductive materials with low resistivity, such as solder or solder alloy. Exemplary elements included in the solder alloy include Sn, Pb, Ag, Cu, Ni, Bi or combinations thereof.

As shown in FIG. 2D, the conductive material 234 has two terminals respectively formed on the front side 201 and back side 203 of the substrate 200. One terminal of the conductive material 234 is connected to the poly pattern 238, and another terminal of the conductive material 234 is connected to the conductive bump 236.

It should be noted that the first and the second guard ring doped regions 242 and 244 are coupled to a ground terminal GND. Therefore, the noise coupling from the substrate 200 or the TSV structure 230 are transmitted to the first and the second guard ring doped regions 242 and 244 and then to the ground terminal GND. For example, the noise coupling from the TSV structure 230 is transmitted to the ground terminal GND through the substrate 200 and the guard ring doped regions 242 and 244, marked by arrow 290 in FIG. 2D.

In some embodiments, the first and second guard ring doped regions 242 and 244 have a depth $D_1$ in a range from about few hundred nm to about few μm. In some embodiments, a ratio ($D_1/H_1$) of the depth $D_1$ of the guard ring doped regions to the height $H_1$ of the through silicon via (TSV) interconnect structure 230 is in a range from 30 μm to about 100 μm. If the ratio ($D_1/H_1$) is too low, less noise is absorbed by second guard ring doped regions 244. If the ratio ($D_1/H_1$) is too high, less noise is absorbed by second guard ring doped regions 244.

Figure 3:
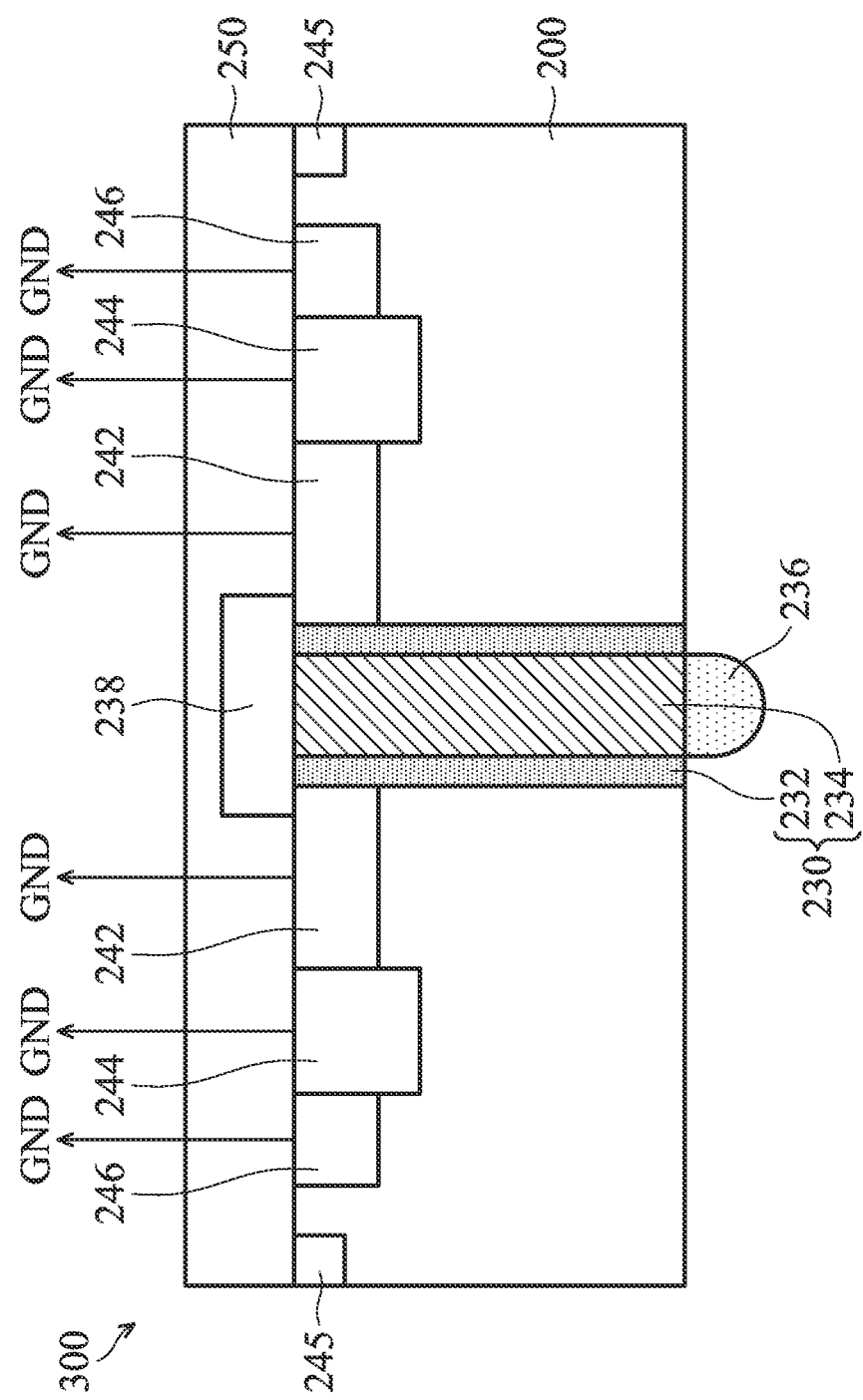
FIG. 3 shows a cross-sectional representation of a semiconductor package structure, in accordance with some embodiments of the disclosure.

FIG. 3 shows a cross-sectional representation of a semiconductor package structure, in accordance with some embodiments of the disclosure. FIG. 3 is similar to FIG. 2D, the difference between FIG. 2D and FIG. 3 being that a third guard ring doped region 246 is formed adjacent to the second guard ring doped region 244 in FIG. 3. In other words, the third guard ring doped region 246 is formed between the well region 245 and the second guard ring doped region 244.

Figure 4:
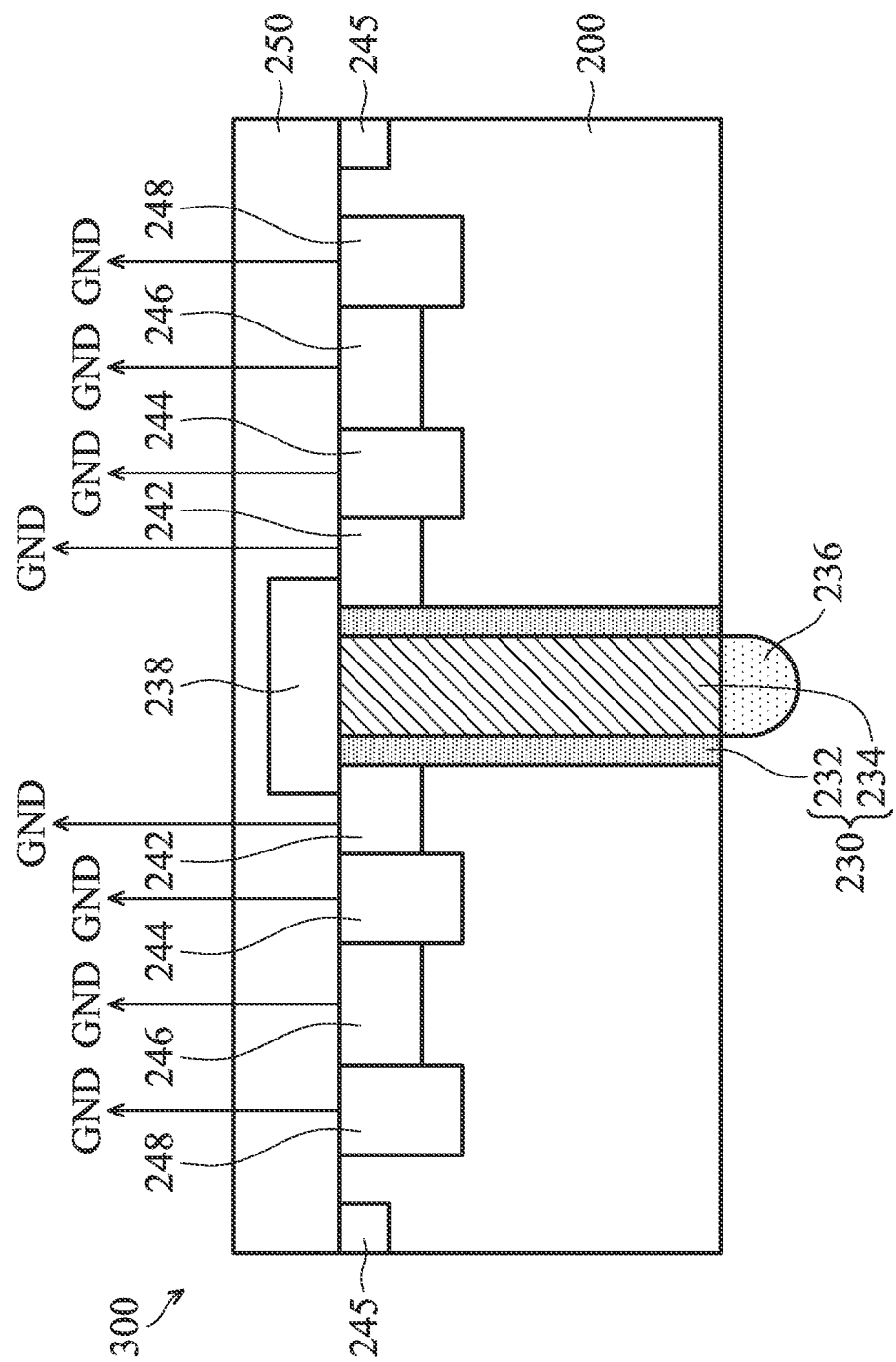
FIG. 4 shows a cross-sectional representation of a semiconductor package structure, in accordance with some embodiments of the disclosure.

FIG. 4 shows a cross-sectional representation of a semiconductor package structure, in accordance with some embodiments of the disclosure. FIG. 3 is similar to FIG. 2D, the difference between FIG. 2D and FIG. 4 being that a fourth guard ring doped region 248 is formed adjacent to the third guard ring doped region 246 in FIG. 4. The number of guard ring doped regions is not limited to two, three or four, and it may be adjusted according to the actual application.

Embodiments for forming a semiconductor package structure are provided. A through silicon via (TSV) interconnect structure is formed in a substrate. At least two guard ring doped regions are formed in a substrate and adjacent to the TSV structure. The guard ring doped regions are coupled to a ground terminal. The two adjacent guard ring doped regions have different doped regions. The n-type guard ring doped region is adjoined to the p-type guard ring doped region. The noise signals with high frequency or low frequency from the substrate or the TSV structure can be transmitted to a ground GND by using the guard ring doped regions. Moreover, the semiconductor package structure can be applied to the TSV technology without additional fabrication steps.

In some embodiments, a semiconductor package structure is provided. The semiconductor package structure includes a substrate and the substrate has a front side and a back side. The semiconductor package structure includes a through silicon via (TSV) interconnect structure formed in the substrate; and a first guard ring doped region and a second guard ring doped region formed in the substrate, and the first guard ring doped region and the second guard doped region are adjacent to the TSV interconnect structure.

In some embodiments, a method for forming a semiconductor package structure is provided. The method includes providing a substrate and the substrate has a front side and a back side. The method also includes forming a first guard ring doped region and a second guard ring doped region in the substrate. The method also includes forming a trench through the substrate from a back side of the substrate and conformally forming an insulating layer lining the back side of the substrate, a bottom surface and sidewalls of the trench. The method further includes removing a portion of the insulating layer on the back side of the substrate to form a through via; and forming a conductive material in the through via, wherein a through silicon via (TSV) interconnect structure is formed by the insulating layer and the conductive material.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising
   a substrate, wherein the substrate has a front side and a back side;
   a through silicon via (TSV) interconnect structure formed in the substrate; and
   a first guard ring doped region and a second guard ring doped region formed in the substrate, wherein the first and the second guard ring doped regions are adjacent to the TSV interconnect structure, wherein the first guard ring doped region and the second guard ring doped region have different conductive types.

2. The semiconductor package structure as claimed in claim 1, further comprising:
   a third guard ring doped region formed adjacent to the second guard ring doped region.

3. The semiconductor package structure as claimed in claim 2, further comprising:
   a fourth guard ring doped region formed adjacent to the third guard ring doped region.

4. The semiconductor package structure as claimed in claim 1, wherein the first guard ring doped region is a n-type guard ring doped region and the second guard ring doped region is a p-type guard ring doped region.

5. The semiconductor package structure as claimed in claim 4, wherein the n-type guard ring doped region comprises a n-type heavily ($n^+$) doped region in a n-well region.

6. The semiconductor package structure as claimed in claim 4, wherein the p-type guard ring doped region comprises a p-type heavily ($p^+$) doped region in a p-well region.

7. The semiconductor package structure as claimed in claim 1, wherein the first guard ring doped region and the second guard ring doped region are coupled to a ground terminal.

8. The semiconductor package structure as claimed in claim 1, wherein the through silicon via (TSV) interconnect structure comprises:
   a conductive material; and
   an insulating layer surrounding the conductive material.

9. The semiconductor package structure as claimed in claim 8, further comprising:
   a conductive bump formed on the back side of the substrate, wherein the conductive bump is directly formed on the conductive material.

10. The semiconductor package structure as claimed in claim 8, further comprising:
    a poly pattern formed on the front side of the substrate, wherein the poly pattern is directly formed on the conductive material.

11. The semiconductor package structure as claimed in claim 1, further comprising:
    a well region formed adjacent to the second guard ring doped region.

12. A method for forming the semiconductor package structure of claim 1, comprising:
    providing a substrate, wherein the substrate has a front side and a back side;
    forming a first guard ring doped region and a second guard ring doped region in the substrate, wherein the first guard ring doped region and the second guard ring doped region have different conductive types;
    forming a trench through the substrate from a back side of the substrate;
    conformally forming an insulating layer lining the back side of the substrate, a bottom surface and sidewalls of the trench;
    removing a portion of the insulating layer on the back side of the substrate to form a through via; and
    forming a conductive material in the through via, wherein a through silicon via (TSV) interconnect structure is formed by the insulating layer and the conductive material.

13. The method as claimed in claim 12, further comprising:
    forming a conductive bump on the back side of the substrate and the conductive material.

14. The method as claimed in claim 12, before forming the trench through the substrate, further comprising:
    forming a poly pattern on the front side of the substrate.

15. The method as claimed in claim 12, further comprising:
    forming a well region adjacent to the second guard ring doped region.

16. The method as claimed in claim 12, further comprising:
    coupling the first guard ring doped region and the second guard ring doped region to a ground terminal.

17. The method as claimed in claim 12, further comprising:
    forming a third guard ring doped region adjacent to the second guard ring doped region; and
    forming a fourth guard ring doped region adjacent to the third guard ring doped region, wherein a conductive type of the third guard ring doped region is different from that of the fourth guard ring doped region.

18. The method as claimed in claim 12, wherein forming the first guard ring doped region and the second guard ring doped region adjacent to the first doped region comprises:
    forming a n-type heavily (n+) doped region in the n-well region; and
    forming a p-type heavily (p+) doped region in the p-well region.

* * * * *